United States Patent
Peng et al.

(10) Patent No.: US 8,251,467 B2
(45) Date of Patent: Aug. 28, 2012

(54) SERVER ASSEMBLY WITH MULTI-FUNTIONAL FIXING FRAME

(75) Inventors: Wen-Tang Peng, Taipei Hsien (TW); Yi-Liang Hsiao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 141 days.

(21) Appl. No.: 12/813,531

(22) Filed: Jun. 11, 2010

(65) Prior Publication Data

US 2011/0260591 A1 Oct. 27, 2011

(30) Foreign Application Priority Data

Apr. 21, 2010 (TW) ................................ 99112562 A

(51) Int. Cl.
*A47B 91/00* (2006.01)
(52) U.S. Cl. .................................................. 312/351.1
(58) Field of Classification Search ............... 312/351.1, 312/351.2, 249.1, 132, 349, 223.1, 240; 248/678, 248/188.1, 346.01, 346.02; 108/51.11, 57.16, 108/55.1; 206/386, 335; 198/538, 539, 600; 193/38, 41; 414/430, 258, 427
See application file for complete search history.

(56) References Cited

U.S. PATENT DOCUMENTS

| | | | | |
|---|---|---|---|---|
| 1,201,790 A | * | 10/1916 | Allen | 280/32 |
| 4,290,728 A | * | 9/1981 | Leduc | 414/537 |
| 4,798,294 A | * | 1/1989 | Bodi | 206/600 |
| 4,863,024 A | * | 9/1989 | Booth | 206/386 |
| 5,180,134 A | * | 1/1993 | Mallak | 248/544 |
| 5,443,312 A | * | 8/1995 | Schluter | 312/334.27 |
| 5,626,231 A | * | 5/1997 | Kwong et al. | 206/600 |
| 5,676,063 A | * | 10/1997 | Wallace | 108/57.17 |
| 5,842,424 A | * | 12/1998 | Prevot et al. | 108/54.1 |
| 5,911,179 A | * | 6/1999 | Spiczka | 108/51.11 |
| 5,944,169 A | * | 8/1999 | Allen | 198/535 |
| 6,035,790 A | * | 3/2000 | Polando | 108/55.1 |
| 6,126,131 A | * | 10/2000 | Tietz | 248/346.01 |
| 6,539,881 B2 | * | 4/2003 | Underbrink et al. | 108/55.3 |
| 6,615,742 B1 | * | 9/2003 | Swanson | 108/55.5 |
| 6,769,368 B2 | * | 8/2004 | Underbrink et al. | 108/55.3 |
| 7,383,951 B2 | * | 6/2008 | Smolenski et al. | 206/386 |
| 7,455,017 B2 | * | 11/2008 | Carpenter et al. | 108/51.11 |
| 7,699,180 B2 | * | 4/2010 | Mollard et al. | 211/26 |
| 7,762,198 B2 | * | 7/2010 | Rasmusson et al. | 108/54.1 |
| 7,845,894 B2 | * | 12/2010 | Dickinson et al. | 414/430 |
| 7,971,733 B2 | * | 7/2011 | Ponto | 211/41.14 |
| 2002/0108540 A1 | * | 8/2002 | Underbrink et al. | 108/55.3 |
| 2003/0097967 A1 | * | 5/2003 | Underbrink et al. | 108/55.1 |
| 2004/0263035 A1 | * | 12/2004 | Lim et al. | 312/351.1 |
| 2008/0000397 A1 | * | 1/2008 | Dickinson et al. | 108/55.3 |

* cited by examiner

*Primary Examiner* — Darnell Jayne
*Assistant Examiner* — Hiwot Tefera
(74) *Attorney, Agent, or Firm* — Altis Law Group, Inc.

(57) ABSTRACT

An exemplary server assembly includes a computer server system and a fixing frame. The computer server system includes a server cabinet accommodating one or more servers therein. The fixing frame is adaptable to operate under a fixed state for fixing the computer server system onto a surface area, or under a transferable guiding state to obliquely interconnect two surfaces of two different levels, along which the computer server system can be moved between the two surfaces.

5 Claims, 6 Drawing Sheets

SERVER ASSEMBLY WITH MULTI-FUNTIONAL FIXING FRAME

BACKGROUND

1. Technical Field

The present disclosure relates to a server assembly comprising a multi-functional fixing frame which can be assembled in a fixed state or a transferable guiding state according to different needs.

2. Description of Related Art

Computer server systems often include multiple number of standard servers mounted in a standard server cabinet. Each server is a standalone computer that can include many electronic components, such as one or more processors, RAM, fixed disks, AC to DC power supplies, and others. For unified management, the servers are arranged in the server cabinet one-by-one in the order from bottom to top. A common computer server system with the servers received in the server cabinet has a weight of about 200 kilograms.

During shipment of the computer server system, the computer server system is mounted on a stack board via a plurality of fixing structures. After the computer server system reaches a shipment destination, a guiding ramp is positioned and angled between the stack board and the ground. The computer server system can be moved from the stack board onto the guiding ramp, and then slide down the guiding ramp onto the ground. However, since each computer server system needs such a guiding ramp for the shipment to be received, and the guiding ramp is usually metal and is discarded after the computer server system has been moved from the stack board to the ground, thereby increasing the shipping costs of the computer server system, as does waste of materials.

It is thus desirable to provide a server assembly which can overcome the described limitations.

DETAILED DESCRIPTION

Figure 1:
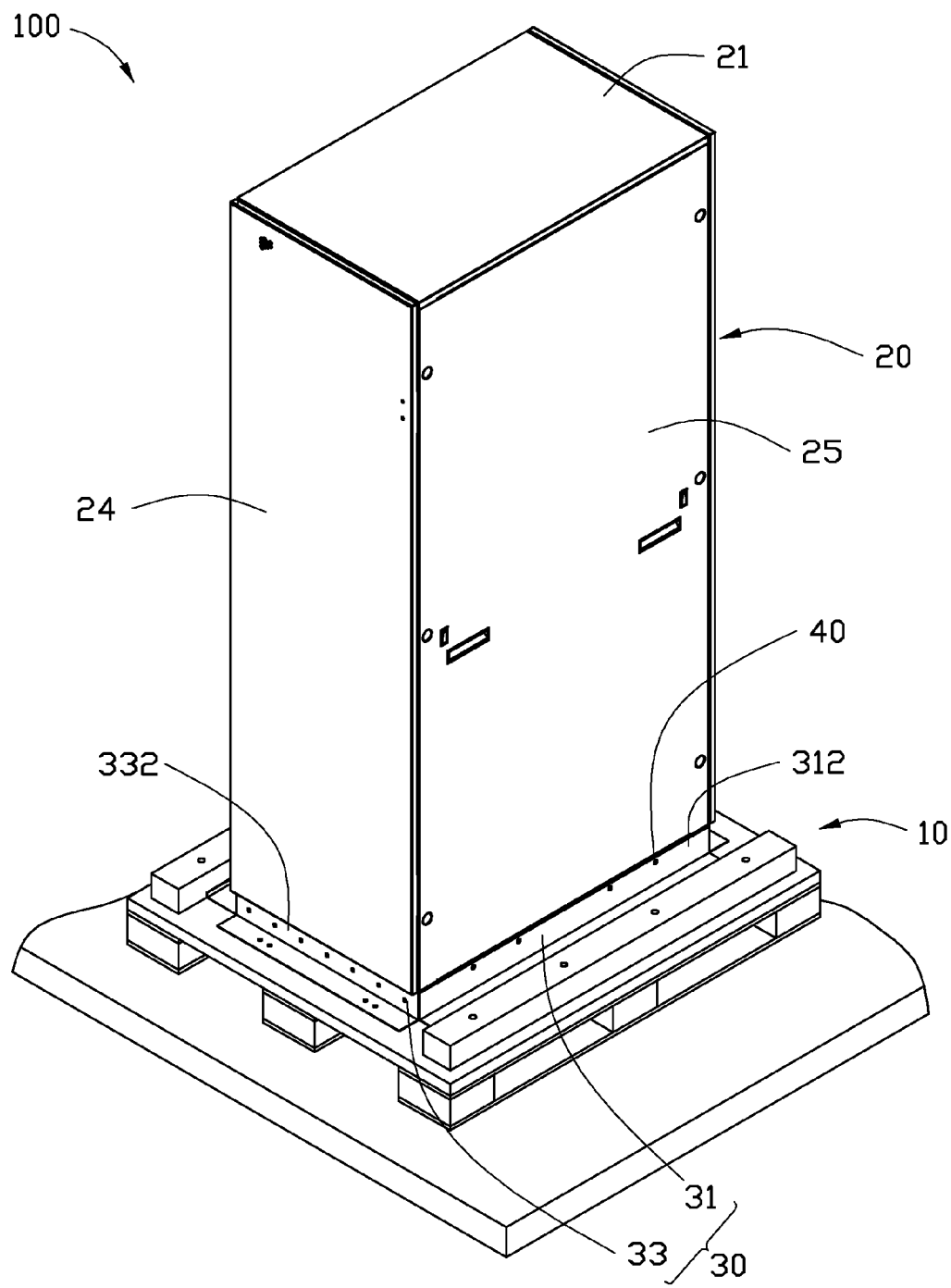
FIG. 1 is an isometric, assembled view of a server assembly in accordance with an exemplary embodiment of the present disclosure, the server assembly comprising a computer server system and a fixing frame; and the computer server system is shown to be mounted on a stack board via the fixing frame.

Reference will now be made to the drawing figures to describe the present server assembly in detail.

Referring to FIG. 1, a server assembly 100 according to an exemplary embodiment of the present disclosure is shown. The server assembly 100 is mounted on a stack board 10 (or pallet) to satisfy shipment requirements. The server assembly 100 includes a computer server system 20 having a plurality of servers (not shown) accommodated in a server cabinet 21 thereof and a fixing frame 30.

Figure 2:
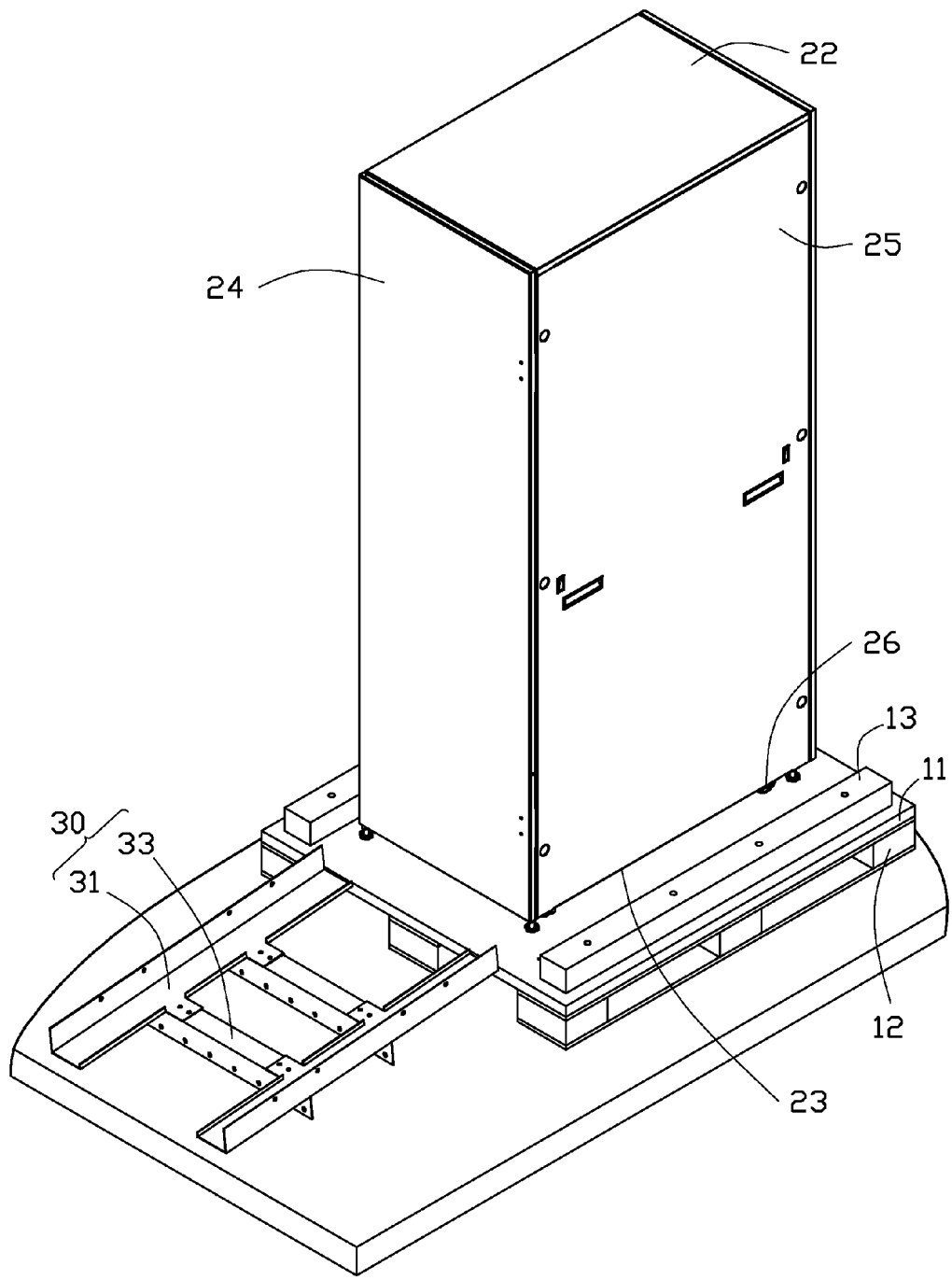
FIG. 2 is similar to FIG. 1, but shows a fixing frame of another embodiment that is positioned between the stack board and the ground, and the fixing frame is to be gently sloped in this position.

Referring to FIG. 2, the stack board 10 includes a supporting plate 11, a plurality of posts 12 depending downward perpendicular to a bottom surface of the supporting plate 11, a plurality of elongated feet (not labeled) supporting the posts 12, and two elongated restraining blocks 13 extending upward perpendicular to a top surface of the supporting plate 11. The supporting plate 11 is rectangular, and configured for supporting the computer server system 20 thereon. The restraining blocks 13 are located at two opposite sides of the top surface of the supporting plate 11, respectively. The computer server system 20 is located between the restraining blocks 13.

The server cabinet 21 is a hollow cuboid container, comprising a rectangular top surface 22, a bottom surface 23 parallel to the top surface 22, two sidewalls 24 connected between two opposite sides of the top surface 22 and the bottom surface 23, respectively, and two side doors 25 connected between the other two opposite sides of the top surface 22 and the bottom surface 23, respectively. The top surface 22, the bottom surface 23, the sidewalls 24 and the side doors 25 cooperatively define a rectangular receiving space for receiving the servers therein. Four wheels 26 are provided on a bottom side of the bottom surface 23. The wheels 26 can for example be a plurality of trolley wheels.

Figure 3:
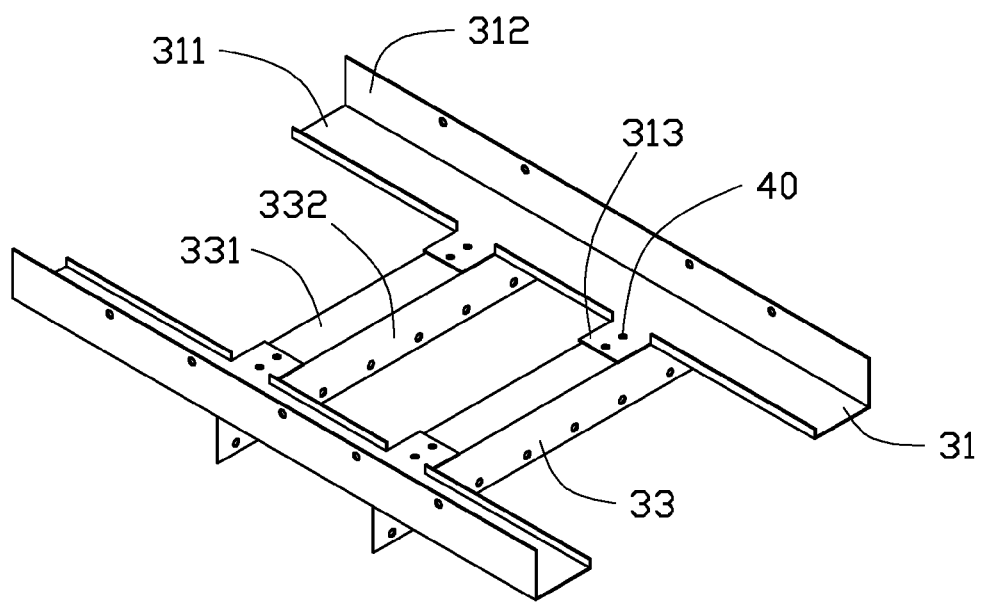
FIG. 3 is an assembled view of the fixing frame operating under a transferable guiding state.
Figure 4:
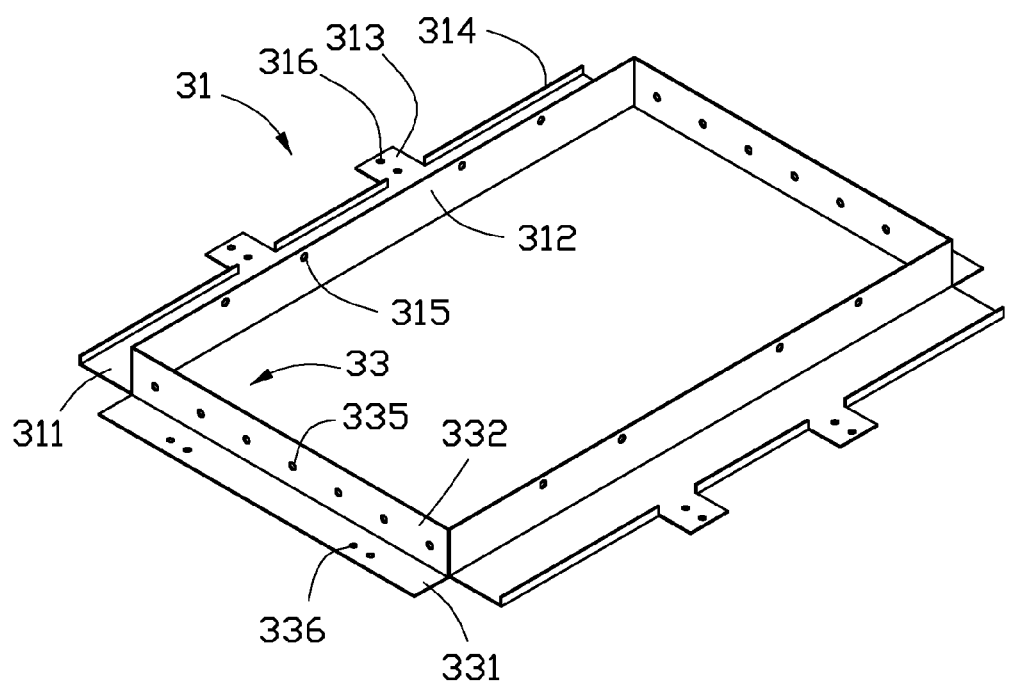
FIG. 4 is an another assembled view of the fixing frame operating under a fixed state.
Figure 5:
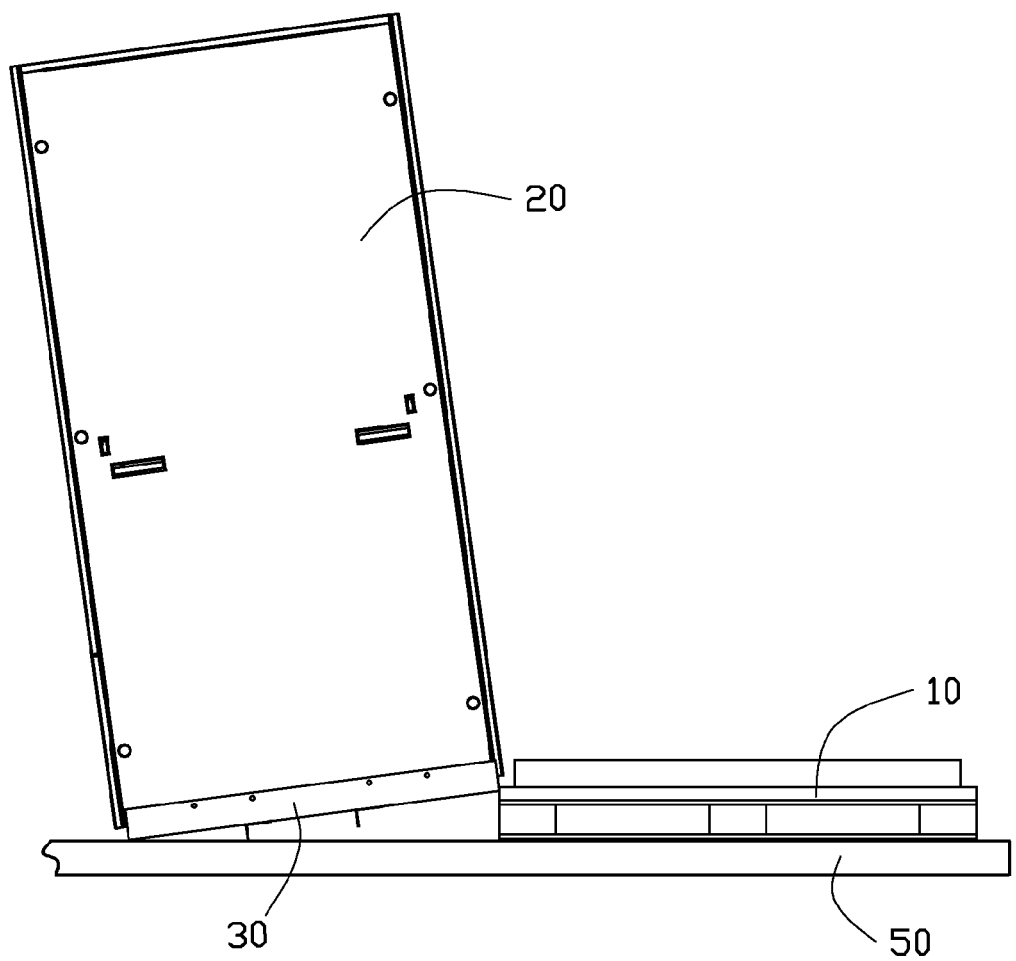
FIG. 5 is a side view of the computer server system of FIG. 2 sliding down the fixing frame to the ground.

The fixing frame 30 includes two first angle frames 31 and two second angle frames 33. Referring to FIGS. 3 and 4 together, each of the first angle frames 31 includes an elongated first plate 311, an elongated second plate 312 extending upwardly and perpendicular to a first lateral side of the first plate 311, two tabs 313 extending outwardly and horizontally from a second lateral side opposite to the first lateral side of the first plate 311 and a flange 314. The two tabs 313 are spaced from each other, and both are located at a middle portion of the first plate 311. Each of the tabs 313 is rectangular, and defines two mounting holes 316 thereon. The tabs 313 and the first plate 311 of each first angle frame 31 are coplanar. The flange 314 extends upwardly and perpendicular to the other portion of the second lateral side of the first plate 311 without the tabs 313 formed thereof. The flange 314 is parallel to the second plate 312, and is shorter than the second plate 312.

A length of the first angle frame 31 is substantially equal to that of the computer server system 20. A plurality of securing holes 315, which are equally spaced from each other, is defined in the second plate 312 along a longitudinal axis thereof.

Each of the second angle frames 33 includes an elongated first fixing wall 331 and an elongated second fixing wall 332 extending perpendicular to one side of the first fixing wall 331. A length of the second angle frame 33 is substantially equal to a width of the computer server system 20. A plurality of connecting holes 336 is defined in two opposite ends of the first fixing wall 331, respectively. The connecting holes 336 defined in each end of the first fixing wall 331 correspond to the securing holes 315 of each of the tabs 313. A plurality of fixing holes 335 equally spaced from each other is defined in the second fixing wall 332 along a longitudinal axis thereof.

During usage, the fixing frame 30 can be repeatedly assembled to a fixed state for fixing the computer server computer 20 on a surface area, or a transferable guiding state to obliquely interconnect two surfaces of two different levels for the computer server system 20 to move therebetween. Referring back to FIG. 1, the fixing frame 30 is operating under the fixed state for fixing the computer server system 20 on the stack board 10 for shipment. Referring also to FIG. 4, the first angle frames 31 are parallel to and spaced from each other, and the second angle frames 33 are located between two opposite ends of the first angle frames 31, respectively. The second plates 312 of the first angle frames 31 and the second fixing walls 332 of the second angle frames 33 abut to form a rectangular frame surrounding the bottom end of the computer server system 20.

The first angle frames 31 are located at the bottom ends of the side doors 25, respectively, with the second plates 312 abutting the side doors 25 and the first plates 311 abutting the supporting plate 11 of the stack board 10. A plurality of fasteners 40, such as bolts, extend through the securing holes 315 of each of the second plates 312, respectively, and are further engageably received in the side doors 25 for connecting the second plates 312 and the side door 25. Simultaneously, the fasteners 40 respectively extend through the mounting holes 316 of the tabs 313 and are further engageably received in the supporting plate 11 for connecting the first plates 311 and the stack board 10 together. Similarly, the second angle frames 33 are located at the bottom ends of the two sidewalls 24, respectively, with the second fixing walls 332 abutting and connecting with the sidewalls 24 and the first fixing walls 331 abutting and connecting with the supporting plate 11 of the stack board 10. As a result, the first angle frames 31 and the second angles frames 33 thereby cooperatively firmly fix the computer server system 20 on the stack board 10.

Referring back to FIG. 2, when the computer server system 20 is to be moved from the stack board 10 to another surface area such as the ground, a fixing frame 30 according to another embodiment is firstly disassembled from the computer server system 20 and the stack board 10, and then is reassembled to form a transferable guiding frame, acting as a ramp, arranged between the stack board 10 and the ground, with one end of the transferable guiding frame connected with one of the sides of the supporting plate 11 which has no restraining blocks 13. Preferably, an angle formed between the transferable guiding frame and the ground does not exceed 10°.

Referring also to FIG. 3, when forming the guiding frame, the first angle frames 31 are spaced from each other by a distance substantially equaling the width of the computer server system 20. The first plates 311 of the first angle frames 31 are adjacent to each other, and the second plates 312 of the first angle frames 31 are away from each other. The first plate 311, the second plate 312 and the flange 314 of each of the first angle frames 31 cooperatively form a sliding track that is angled between the stack board 10 and the ground for the wheels 26 at the bottom side of the computer server system 20 to slide along. The second angle frames 33 are located under the first angle frames 31. Each of the second angle frames 33 is located between a pair of tabs 313 of the first angle frames 31 which are aligned with each other. The connecting holes 336 of the first fixing walls 331 align with the mounting holes 316 of the tabs 313, respectively, and the second fixing walls 332 face the ground. The fasteners 40 respectively extend through the mounting holes 316 of the tabs 313 and the connecting holes 336 of the first fixing walls 331, respectively, to thereby connect the second angle frames 33 and the first angle frames 31. The second angle frames 33 reinforce the first angle frames 31, thereby increasing a carrying capacity of the first angle frames 31.

Figure 6:
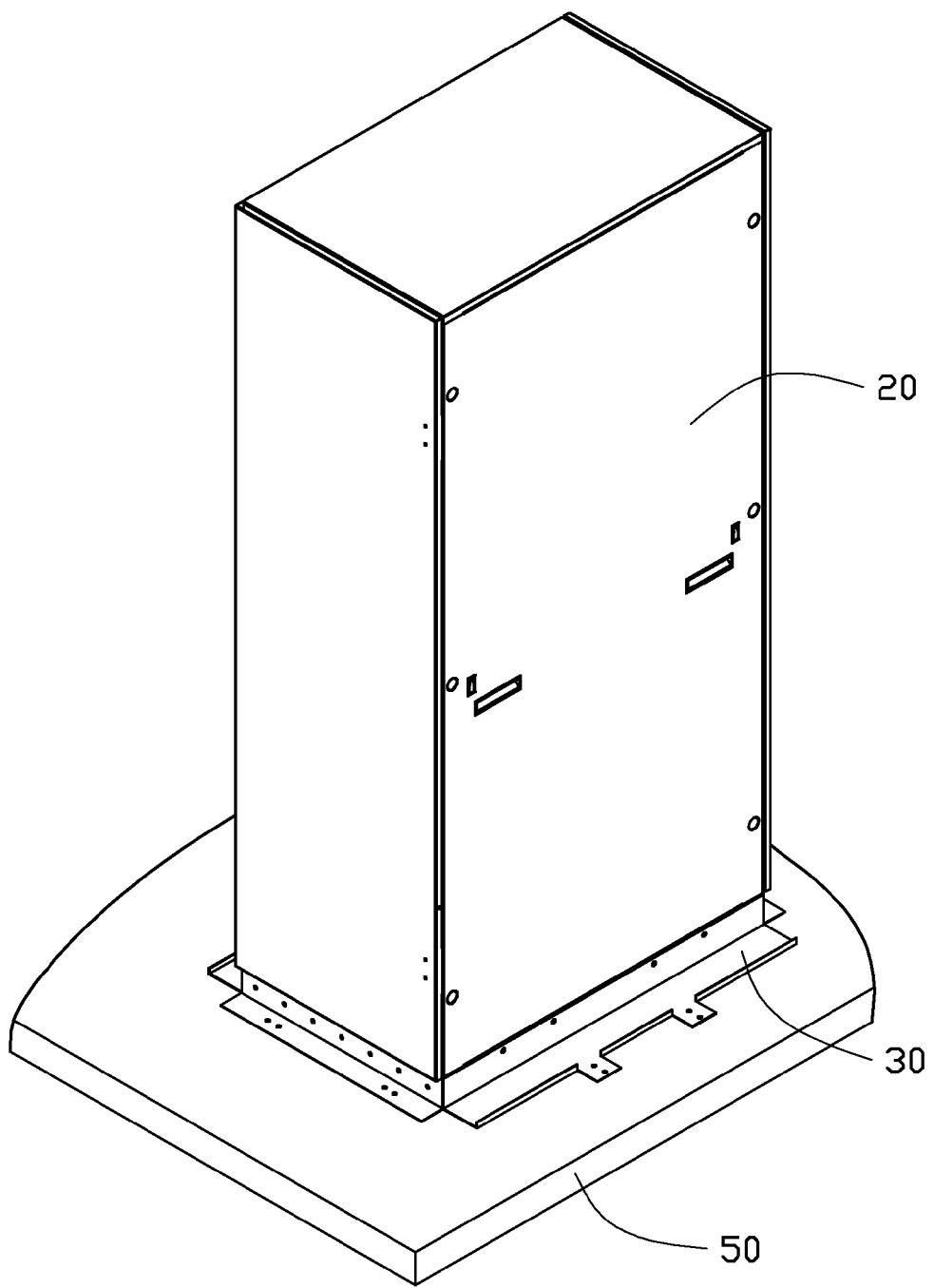
FIG. 6 is an isometric assembled view schematically showing the fixing frame of FIG. 4 fixing the server computer system on the ground.

Finally, referring to FIG. 6, the computer server system 20 is moved to the first angle frames 31 of the transferable guiding frame, and then downward to the ground 50 along the first plates 311 of the first angle frames 31. After the computer server system 20 reaches the ground, the fixing frame 30 is then re-assembled to the fixed state, thereby fixing the computer server system 20 onto the ground, and preventing damage thereto from accidental collision or external impact.

Due to the presence of the tabs 313, a planar sloped surface can be formed by the first plate 311 of each of the first bar frames 31 to connect the side of the supporting plate 11 of the stack board 10 with the ground, without needing a plurality of mounting holes defined therein connecting with the second plates 33. Thus, the computer server system 20 can slide along the first plates 311 of the first bar frames 31 smoothly. Furthermore, since the fixing frame 30 can be repeatedly assembled to the fixed state for fixing the computer server system 20 on different surface areas or to the transferable guiding state for the secure relocation of the computer server system 20, the fixing frame 30 thereby possesses multiple functions, thus there is no need to furnish a separate, dedicated guiding ramp for transport. Thus, the fixing frame 30 provides convenient transportation and lowers costs.

It is to be understood, however, that even though numerous characteristics and advantages of the disclosure have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server assembly comprising:
  a computer server system comprising a server cabinet adapted to accommodate a plurality of servers therein; and
  a fixing frame reconfigurable between a fixed state and a transferable guiding state, the fixing frame comprising two elongated first angle frames and two elongated second angle frames, each of the first angle frames and the second angle frames having an L-shaped cross section, each first angle frame comprising a first plate and a second plate extending perpendicular to the first plate, and each second angle frame comprising a first fixing wall and a second fixing wall extending perpendicular to the first fixing wall;
  wherein when the fixing frame is assembled into the fixed state, the second plates of the first angle frames are parallel to and face each other and connect with two opposite sides of the computer server system, respectively, the second fixing walls of the second angle frames are parallel to and face each other and connect with another two opposite sides of the computer server system, respectively, and the first plates of the first angle frames and the first fixing walls of the second angle frames are coplanar and connect with a first surface area to fix the computer server system on the first surface area; and
  wherein when the fixing frame is assembled into the transferable guiding state, the first angle frames obliquely interconnect the first surface area with a second surface area where the first and second surface areas are located at two different levels, the first plates of the first angle frames are coplanar allowing the computer server system to slide thereon between the first surface area and the second surface area, the second plates of the first angle frames are parallel to and face each other to sandwich the computer server system during the sliding along the first plates of the first angle frames, and the first fixing walls are connected below the first plates of the first angle frames.

2. The server assembly of claim 1, wherein the second plate of each first angle frame extends perpendicular to one side of the first plate, each first angle frame further comprises a flange extending perpendicular to another side of the first plate, and the flange is parallel to the second plate and shorter than the second plate.

3. The server assembly of claim 1, wherein the second plate of each first angle frame extends perpendicular to one side of the first plate, each first angle frame further comprises a tab extending outwardly from another side of the first plate, and when the fixing frame is operating under the transferable guiding state, two opposite ends of each of the second angle frames connect with a pair of tabs between the two first angle frames, respectively.

4. The server assembly of claim 3, wherein when the fixing frame is operating under the transferable guiding state, the second angle frames are located under the first angle frames.

5. The server assembly of claim 1, wherein a plurality of wheels is provided on a bottom side of the computer server system, and when the fixing frame is operating under the tranferable guiding state, the first angle frames act as ramps for the wheels to roll along.

* * * * *